United States Patent
Marshall

(10) Patent No.: US 8,519,753 B2
(45) Date of Patent: Aug. 27, 2013

(54) FREQUENCY DOUBLER/INVERTER

(75) Inventor: Andrew Marshall, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 207 days.

(21) Appl. No.: 12/966,784

(22) Filed: Dec. 13, 2010

(65) Prior Publication Data

US 2012/0146690 A1    Jun. 14, 2012

(51) Int. Cl.
*H03B 19/00*    (2006.01)

(52) U.S. Cl.
USPC .............................. 327/114; 327/65; 327/122

(58) Field of Classification Search
None
See application file for complete search history.

(56) References Cited

U.S. PATENT DOCUMENTS

| | | | | |
|---|---|---|---|---|
| 5,815,014 | A * | 9/1998 | Zhang et al. | 327/122 |
| 6,249,876 | B1 * | 6/2001 | Balakrishnan et al. | 713/501 |
| 6,459,311 | B1 * | 10/2002 | Kim | 327/122 |
| 7,053,725 | B1 * | 5/2006 | Wu et al. | 331/156 |
| 7,820,078 | B2 * | 10/2010 | Louwet | 252/500 |
| 2008/0068052 | A1 * | 3/2008 | Tsai et al. | 327/116 |
| 2008/0246095 | A1 * | 10/2008 | Wu et al. | 257/401 |
| 2009/0079487 | A1 * | 3/2009 | Arnborg et al. | 327/285 |
| 2009/0267647 | A1 * | 10/2009 | Kim et al. | 326/50 |
| 2010/0065833 | A1 | 3/2010 | Huang et al. | |
| 2010/0214034 | A1 | 8/2010 | Peng et al. | |
| 2010/0276669 | A1 * | 11/2010 | Richter et al. | 257/24 |
| 2012/0018706 | A1 * | 1/2012 | Kagan et al. | 257/40 |
| 2012/0025165 | A1 * | 2/2012 | Armitage et al. | 257/9 |

OTHER PUBLICATIONS

"Graphene Frequency Multipliers," IEEE Electron Device Letters, vol. 30, No. 5, May 2009, pp. 547-549 (Han Wang, Daniel Nezich, Jing Kong, and Tomas Palacios).
"Ambipolar Electronics," Rice University, TREE 1002, Mar. 2, 2010, pp. 1-5 (Yang and Mohanram).

\* cited by examiner

*Primary Examiner* — Cassandra Cox
(74) *Attorney, Agent, or Firm* — Alan A. R. Cooper; W. James Brady, III; Frederick J. Telecky, Jr.

(57) ABSTRACT

Here, an apparatus is provided. The apparatus comprises a first supply rail, a second supply rail, a first ambipolar transistor (which is coupled to the first supply rail at its drain and which receives a reference voltage at its gate), a second ambipolar transistor (which is coupled to the first supply rail at its drain and which receives an input signal at its gate), a current source (which is coupled between the sources of the first and second ambipolar transistors and the second supply rail), and an output circuit (which is coupled to drain of the first ambipolar transistor). In operation, the output circuit provides an output signal having a frequency that is about twice the frequency of the input signal.

16 Claims, 7 Drawing Sheets

US 8,519,753 B2

FREQUENCY DOUBLER/INVERTER

TECHNICAL FIELD

The invention relates generally to a frequency doubler or inverter and, more particularly, to frequency doubler or inverter employing ambipolar transistors.

BACKGROUND

Turning to FIG. 1, an example of a conventional comparator 100 can be seen. This comparator 100 generally comprises a differential input pair Q1 and Q2 (which are NMOS transistors), current mirror (which is generally comprised of PMOS transistors Q3 and Q4), current source 102, and output circuit 106 (which generally includes PMOS transistor Q3 and current source 104). In operation, a reference voltage REF is applied to the gate of transistor Q1, while an input signal IN is applied to the gate of transistor Q2. Based on a comparison of the input signal IN to the reference voltage REF, the output circuit 106 will provide an output signal that is logic high ("1") or logic low ("0").

In FIG. 2, an example of the operation of comparator 100 can be seen. For this example, the reference voltage REF is 0.75V, while the input signal IN is linearly increased or ramped. When the input signal IN is less than 0.75V, the output signal VOUT is logic high (i.e., about 1.5V), but once the input signal become greater than 0.75V, the output signal VOUT transitions to logic low (i.e., about 0V).

There are, however, other transistors that exhibit behaviors that are different from bipolar or unipolar transistors; these transistors are ambipolar transistors. Some examples of ambipolar transistors are graphene transistors, carbon nanotube (CNT) transistors, tunneling FETs (TFETs), and organic FETs (OFETs). As shown in FIG. 3, ambipolar transistors have an unusual gate response (where the drain current ID is large when the gate-source voltage VGS is low). As a result, it is generally unreasonable to replace bipolar or unipolar transistors with ambipolar transistors in conventional circuits (i.e., comparator 100) and expect that these conventional circuits will exhibit the same or similar behavior.

Therefore, there is a need for new circuits that take advantage of the characteristics of ambipolar transistors.

Some examples of uses for ambipolar transistors are: U.S. Patent Pre-Grant Publ. No. 2010/0065833; and U.S. Patent Pre-Grant Publ. No. 2010/0214034.

SUMMARY

A preferred embodiment of the present invention, accordingly, provides an apparatus. The apparatus comprising a first supply rail; a second supply rail; a first ambipolar transistor that is coupled to the first supply rail at its drain and that receives a reference voltage at its gate; a second ambipolar transistor that is coupled to the first supply rail at its drain and that receives an input signal at its gate, wherein the input signal having a first frequency; a current source that is coupled between the sources of the first and second ambipolar transistors and the second supply rail; and an output circuit that is coupled to drain of the first ambipolar transistor and that outputs an output signal having a second frequency, wherein the second frequency is about twice the first frequency.

In accordance with another preferred embodiment of the present invention, the apparatus further comprises a current minor having: a first PMOS transistor that is coupled to the first supply rail at its source and coupled to the drain of the first ambipolar transistor at its drain; and a second PMOS transistor that is coupled to the first supply rail at its source and coupled to the drain of the second ambipolar transistor and the gate of the first PMOS transistor at its gate and drain.

In accordance with another preferred embodiment of the present invention, the current source further comprises a first current source, and wherein the output circuit further comprises: a third PMOS transistor that is coupled to the first supply rail at its source and the drain of the first ambipolar transistor at its gate; and a second current source that is coupled between the drain of the third PMOS transistor and the second supply rail.

In accordance with another preferred embodiment of the present invention, the first and second ambipolar transistors further comprise graphene transistors, carbon nanotube (CNT) transistors, tunneling FETs (TFETs), or organic ambipolar FETs.

In accordance with another preferred embodiment of the present invention, an apparatus is provided. The apparatus comprises a first supply rail; a second supply rail; a first ambipolar transistor that is coupled to the first supply rail at its drain and that receives a reference voltage at its gate, wherein the reference voltage is substantially equal to logic high; a second ambipolar transistor that is coupled to the first supply rail at its drain and that receives an input signal at its gate, wherein the input signal is substantially a square wave; a current source that is coupled between the sources of the first and second ambipolar transistors and the second supply rail; and an output circuit that is coupled to drain of the first ambipolar transistor and that outputs an output signal that is substantially the inverse of the input signal.

In accordance with another preferred embodiment of the present invention, an apparatus is provided. The apparatus comprises a first supply rail; a second supply rail; and a frequency quadrupler that receives an input signal that is substantially a triangular wave signal or a sine wave signal having a first frequency and that outputs a output signal that is substantially a pulse train signal having a second frequency, wherein the second frequency is about four times the first frequency, and wherein the quadruper has a first frequency doubler and a second frequency doubler coupled together in a pipeline, wherein each of the first and second frequency doublers includes: an input terminal; an output terminal; a first ambipolar transistor that is coupled to the first supply rail at its drain and that receives a reference voltage at its gate; a second ambipolar transistor that is coupled to the first supply rail at its drain and to the input terminal at its gate; a current source that is coupled between the sources of the first and second ambipolar transistors and the second supply rail; and an output circuit that is coupled to drain of the first ambipolar transistor and to the output terminal.

In accordance with another preferred embodiment of the present invention, each frequency doubler further comprises a current minor having: a first PMOS transistor that is coupled to the first supply rail at its source and coupled to the drain of the first ambipolar transistor at its drain; and a second PMOS transistor that is coupled to the first supply rail at its source and coupled to the drain of the second ambipolar transistor and the gate of the first PMOS transistor at its gate and drain.

In accordance with another preferred embodiment of the present invention, wherein the current source further comprises a first current source, and wherein each output circuit further comprises: a third PMOS transistor that is coupled to the first supply rail at its source, the drain of the first ambipolar transistor at its gate, and its output terminal at its drain; and a second current source that is coupled between the drain of the third PMOS transistor and the second supply rail.

In accordance with another preferred embodiment of the present invention, an apparatus is provided. The apparatus comprises a first supply rail; a second supply rail; and a delay line that receives an input signal that is substantially a square wave signal, wherein the delay line has a plurality of inverters coupled together in a pipeline, wherein each of the inverters includes: an input terminal; an output terminal; a first ambipolar transistor that is coupled to the first supply rail at its drain and that receives a reference voltage at its gate, wherein the reference voltage is approximately equal to logic high; a second ambipolar transistor that is coupled to the first supply rail at its drain and to the input terminal at its gate; a current source that is coupled between the sources of the first and second ambipolar transistors and the second supply rail; and an output circuit that is coupled to drain of the first ambipolar transistor and to the output terminal.

In accordance with another preferred embodiment of the present invention, wherein each inverter further comprises a current minor having: a first PMOS transistor that is coupled to the first supply rail at its source and coupled to the drain of the first ambipolar transistor at its drain; and a second PMOS transistor that is coupled to the first supply rail at its source and coupled to the drain of the second ambipolar transistor and the gate of the first PMOS transistor at its gate and drain.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
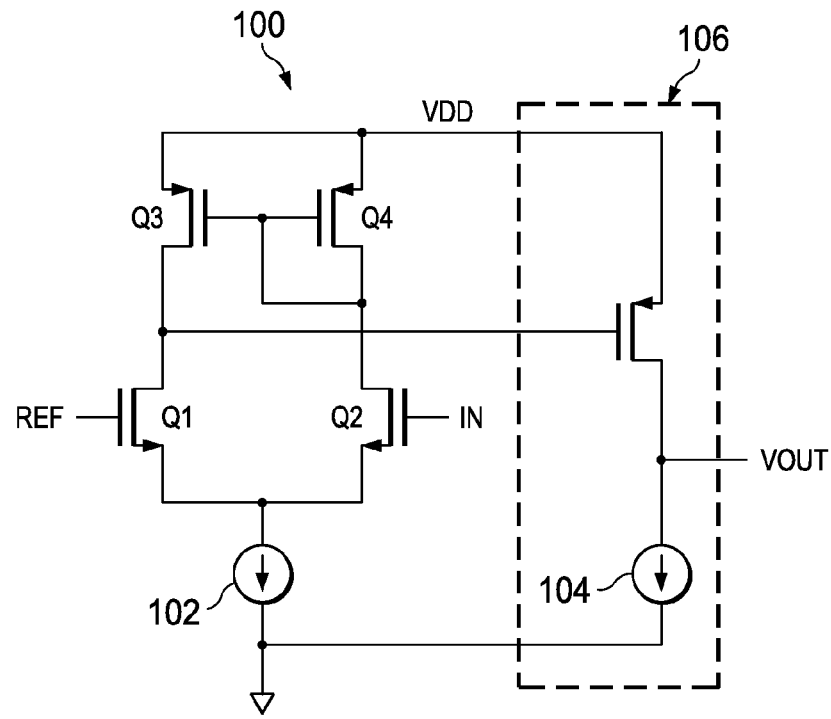
FIG. 1 is a diagram of an example of a conventional comparator.

Refer now to the drawings wherein depicted elements are, for the sake of clarity, not necessarily shown to scale and wherein like or similar elements are designated by the same reference numeral through the several views.

Figure 4:
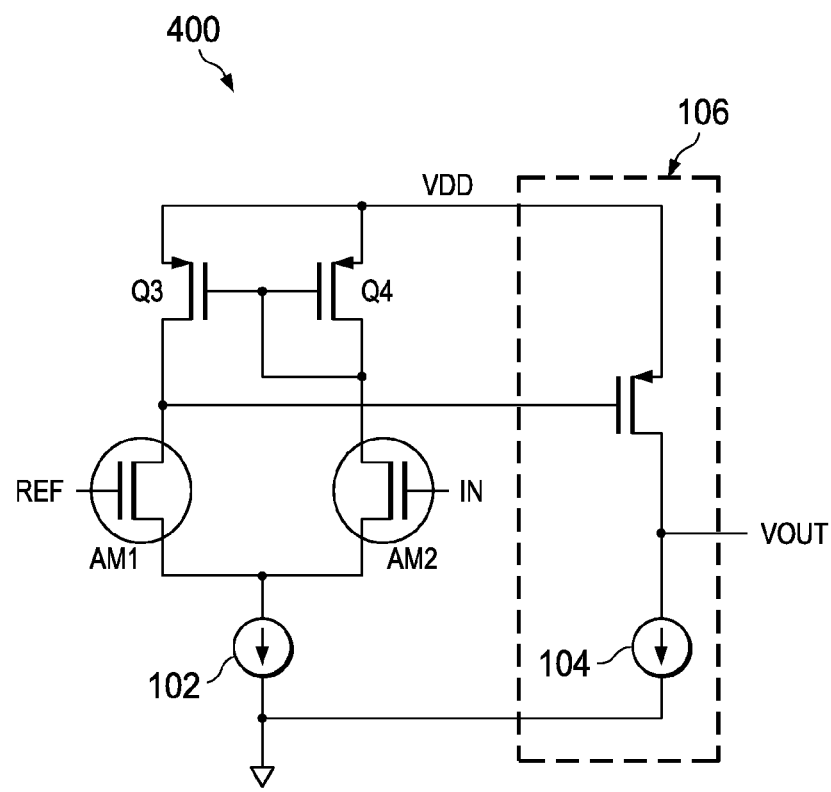
FIG. 4 is a diagram of an example of a circuit in accordance with a preferred embodiment of the present invention.
Figure 2:
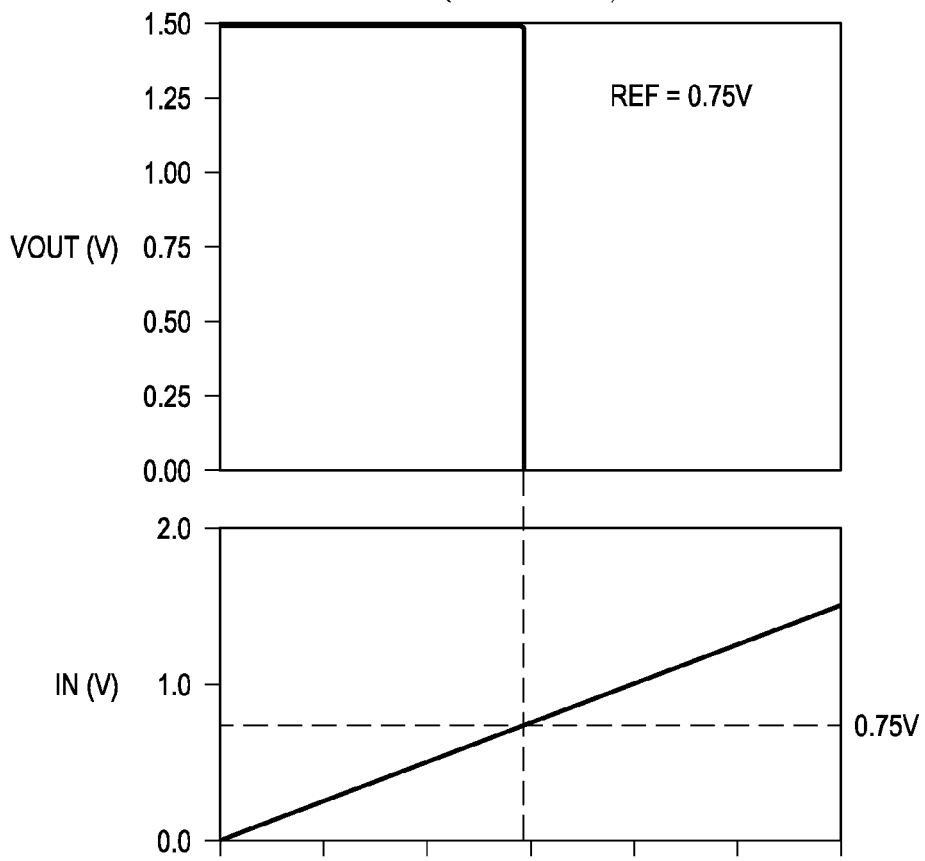
FIG. 2 is a diagram depicting an example operation of comparator of FIG. 1.
Figure 3:
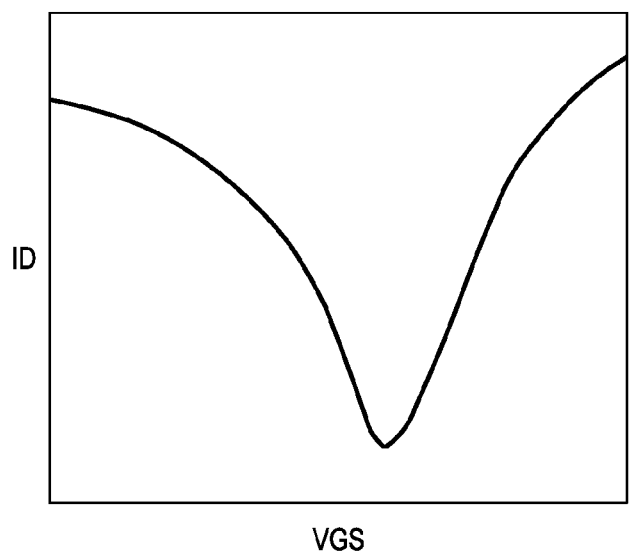
FIG. 3 is an example of the I-V characteristics of an ambipolar transistor.

Turning to FIG. 4, an example of a circuit 400 in accordance with a preferred embodiment of the present invention. The circuit 400 is similar in construction to the comparator 100 of FIG. 1; however, the unipolar (NMOS) transistors Q1 and Q2 of FIG. 1 have been replaced by the ambipolar transistors AM1 and AM2. Because of the characteristics (namely, the I-V characteristics) of ambipolar transistors AM1 and AM2, circuit 400 does not function as a comparator. Circuit 400 generally can, instead, operate as a frequency doubler or an inverter depending on the value of the reference voltage REF. Alternatively, the current minor (i.e., PMOS transistors Q3 and Q4) can be replaced by resistors or biased PMOS transistors.

Figure 5:
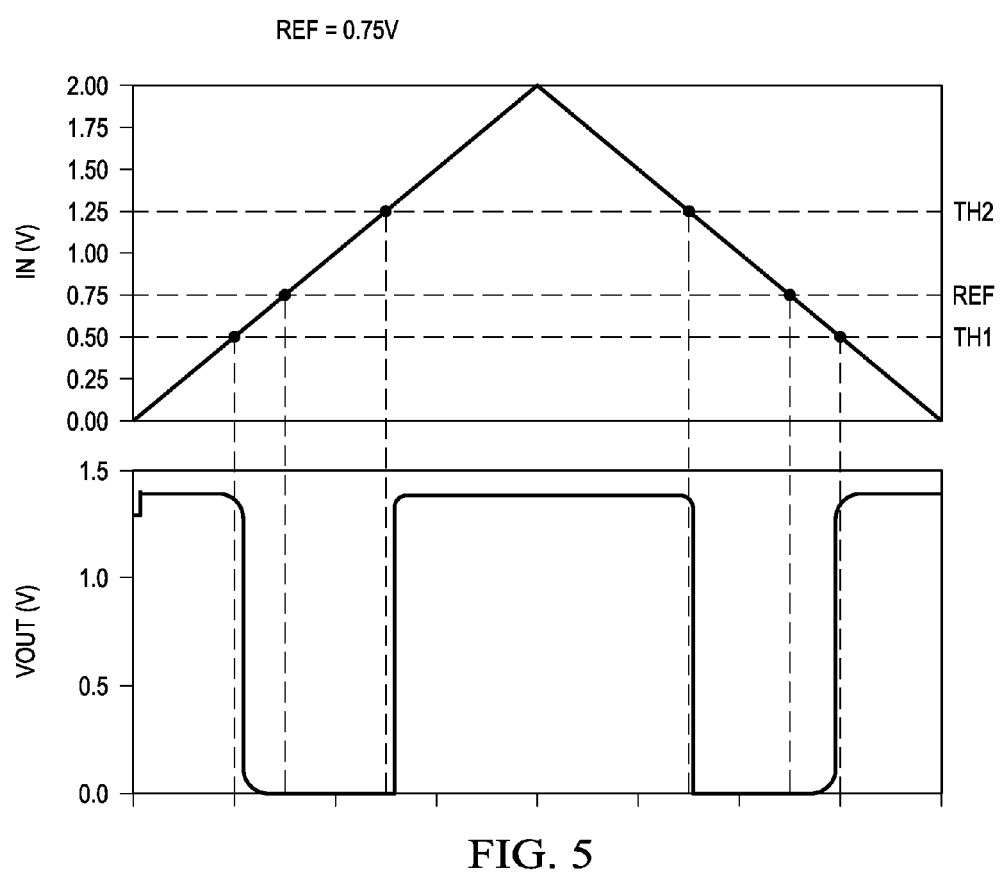
FIGS. 5 and 6 are diagrams depicting examples of the operation of the circuit of FIG. 4 as a frequency doubler.
Figure 6:
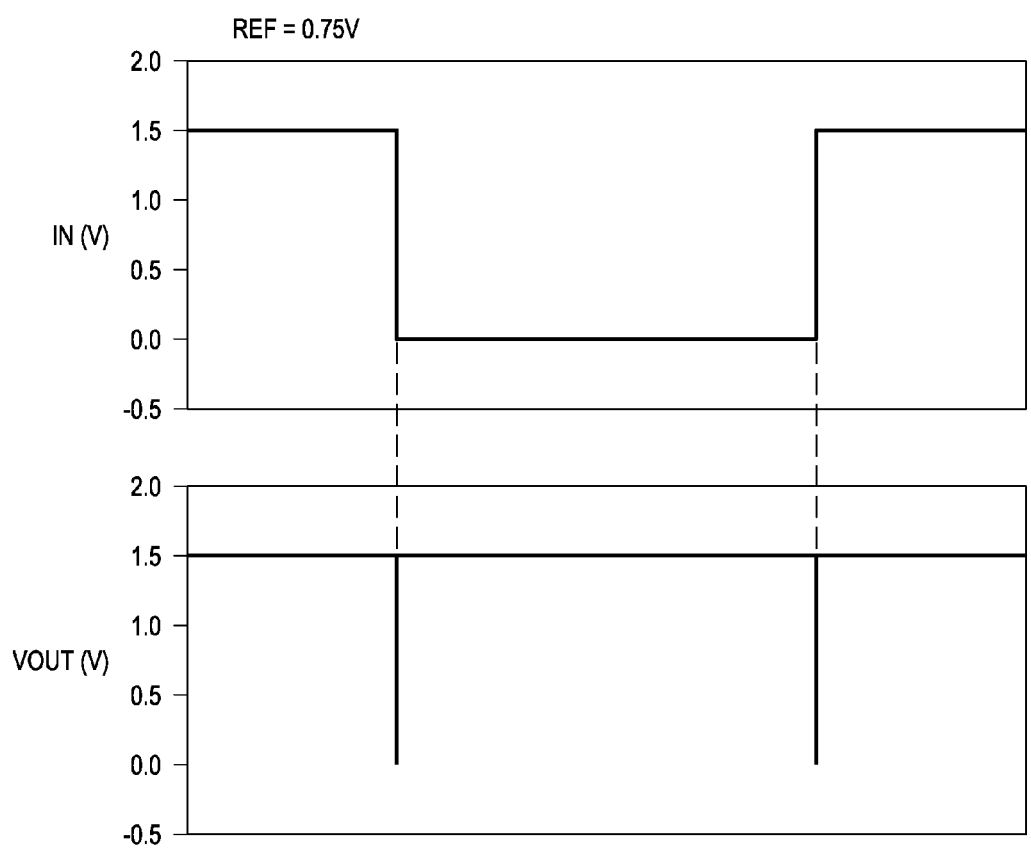

In FIG. 5, an example of the response for operation of circuit 400 (as a frequency doubler) can be seen. For this example, the reference voltage REF is set to 0.75V, and the input signal IN is a triangular wave. Initially, as shown, the input signal IN is at 0V, meaning that the output signal VOUT should be at logic high or "1" (i.e., about 1.5V). As the input signal IN increases (increasing the gate-source voltage for transistor AM2), the drain current for transistor AM2 decreases, entering the "valley" of its I-V curve. When this drain current for transistor AM2 becomes sufficiently low (at threshold voltage TH1), the output signal VOUT transitions to logic low or "0" (i.e., about 0V). The output signal VOUT then remains at logic low until the input signal IN becomes sufficiently large enough so that the drain current becomes large enough to allow output signal VOUT to transition back to logic high or "1" at threshold voltage TH2. The output signal VOUT, then, becomes logic low or "0" between thresholds TH2 and TH1 as the input signal IN decreases from its peak (i.e., at about 2.0V) to 0V, producing a square wave as the output signal VOUT. As shown, reference voltage REF is between the thresholds TH1 and TH2. Additionally, a sine wave may be used to achieve in place of the triangular wave to achieve substantially the same result. Moreover, if the input signal IN is a square wave (as shown in FIG. 6), the output signal VOUT is a pulse train signal.

Figure 7:
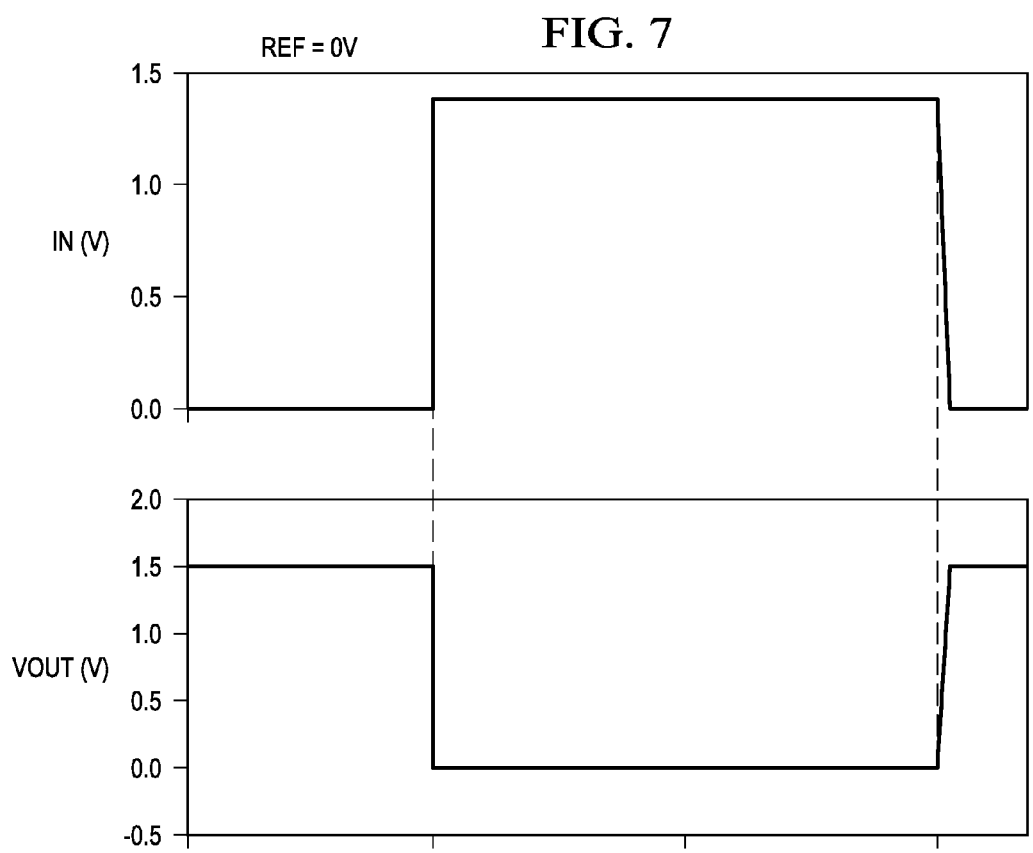
FIG. 7 is a diagram of an example of the operation of the circuit of FIG. 4 as an inverter.

If the reference voltage REF is set to logic high (i.e., about 1.5V), then the circuit 400 begins to function as an inverter, as shown in FIG. 7. For this example, when the input signal is logic high or "1" (i.e., about 1.5V), the output signal VOUT will be logic high or "1," similar to FIG. 5. When the input signal IN transitions to logic high or "1," the output signal VOUT becomes logic low or "0" (i.e., about 0V). Thus, by adjusting the reference voltage REF, the frequency doubler can become an inverter.

Figure 8:
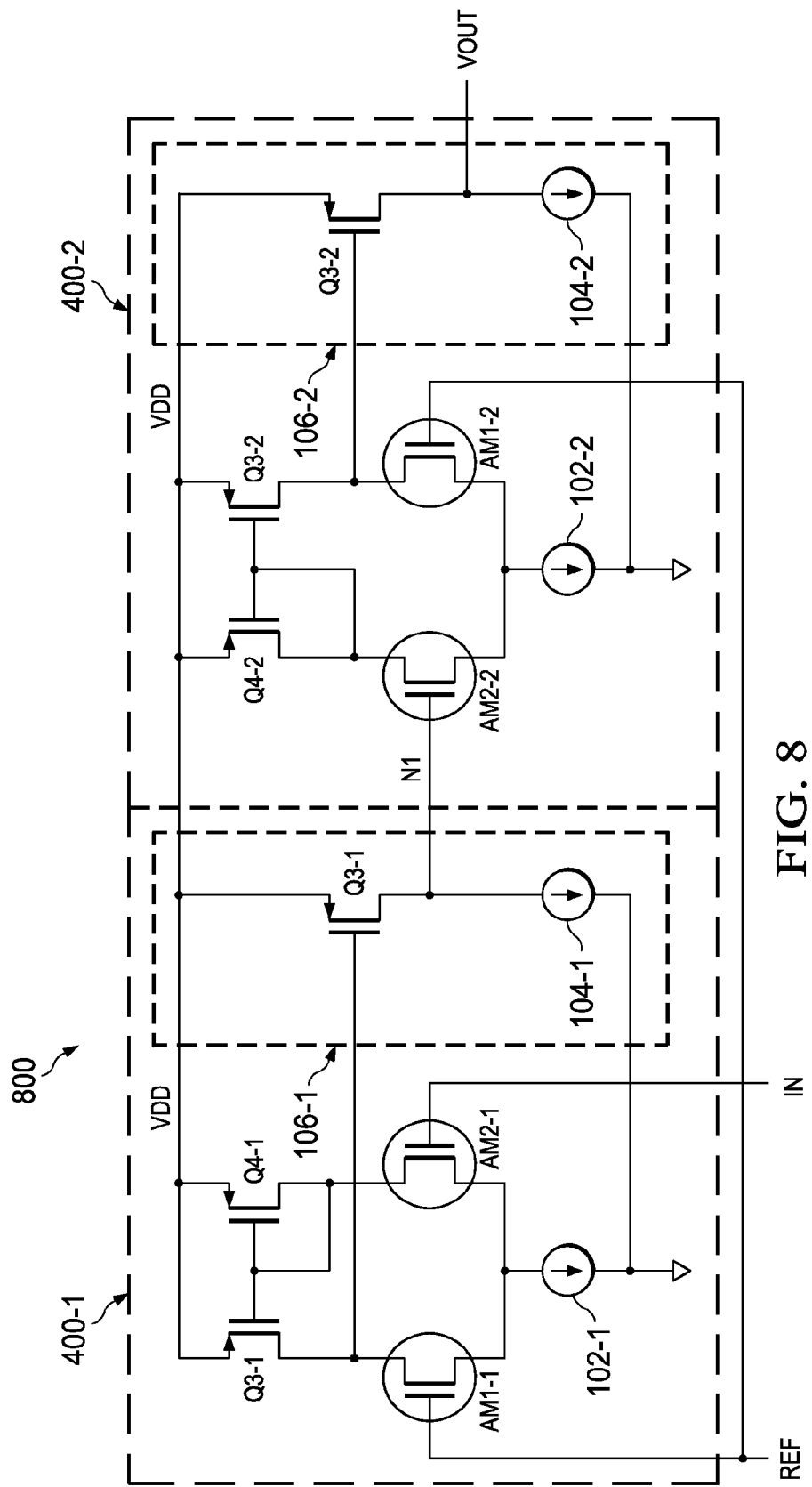
FIG. 8 is a diagram of an example of a frequency quadrupler that employs the circuit of FIG. 4.
Figure 9:
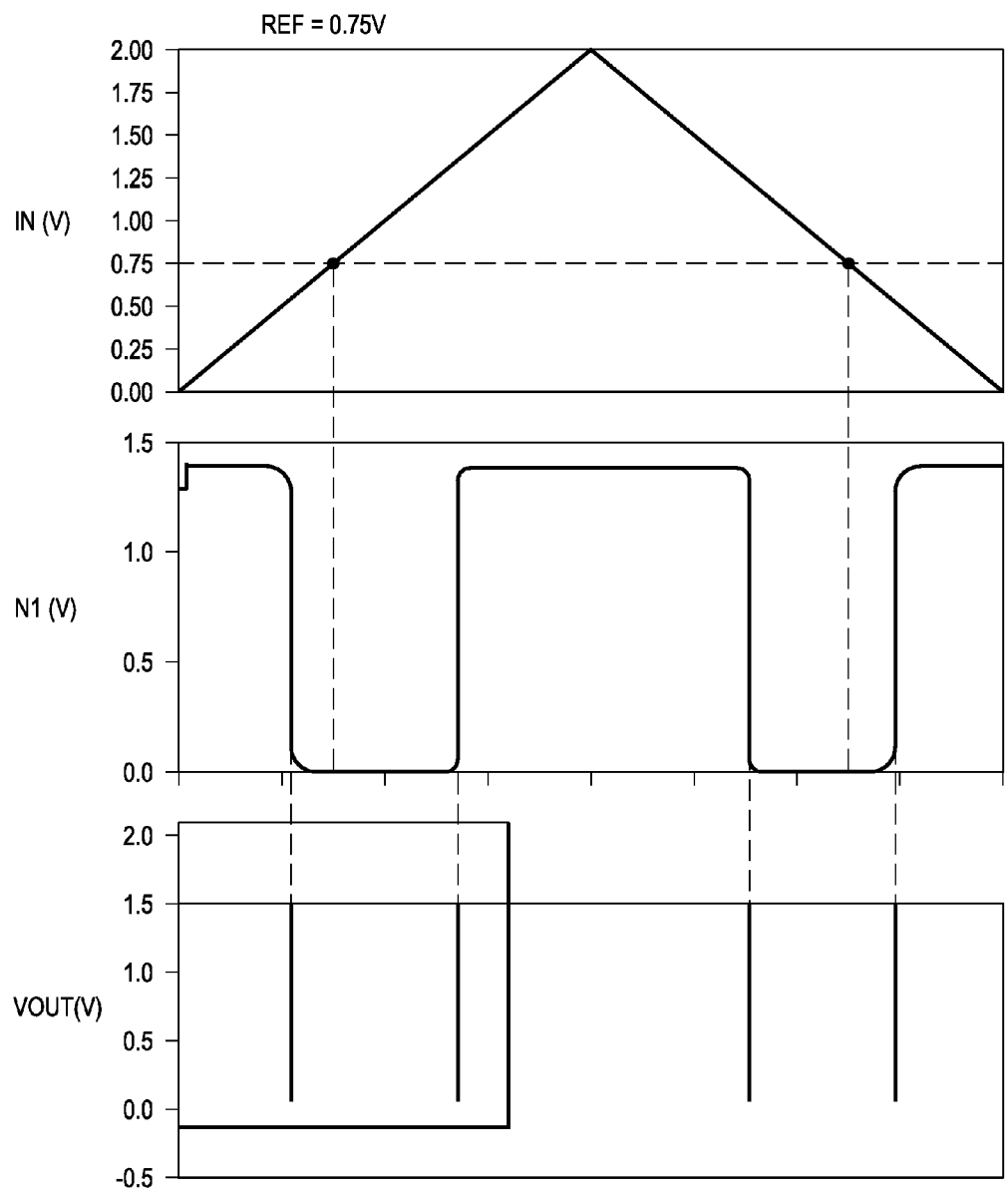
FIG. 9 is a diagram depicting the operation of the frequency quadrupler of FIG. 8.

Now turning to FIG. 8, a frequency quadrupler 800 can be seen. As shown, this frequency quadrupler 800 is generally comprised of circuits 400-1 and 400-2 coupled in series with one another. If the reference voltage REF is set so that each of the circuits 400-1 and 400-2 can operate as a frequency doubler (like FIGS. 5 and 6), then a pulse train signal can be generated from a sine wave or square wave (as the input signal IN), where the pulse train signal has a frequency that is approximately quadruple the input signal IN. An example of this can be seen in FIG. 9 (where the reference voltage REF is set to about 0.75V). Alternatively, if the reference voltage REF is set so that circuits 400-1 and 400-2 operate as inverters, frequency quadrupler 800 would operate like two inverters coupled in series with one another (i.e., delay line).

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
a first supply rail;
a second supply rail;
a first ambipolar transistor that is coupled to the first supply rail at its drain and that receives a reference voltage at its gate;
a second ambipolar transistor that is coupled to the first supply rail at its drain and that receives an input signal at its gate, wherein the input signal having a first frequency;
a current source that is coupled between the sources of the first and second ambipolar transistors and the second supply rail; and
an output circuit that is coupled to drain of the first ambipolar transistor and that outputs an output signal having a second frequency, wherein the second frequency is about twice the first frequency.

2. The apparatus of claim 1, wherein the apparatus further comprises a current mirror having:
a first PMOS transistor that is coupled to the first supply rail at its source and coupled to the drain of the first ambipolar transistor at its drain; and
a second PMOS transistor that is coupled to the first supply rail at its source and coupled to the drain of the second ambipolar transistor and the gate of the first PMOS transistor at its gate and drain.

3. The apparatus of claim 2, wherein the current source further comprises a first current source, and wherein the output circuit further comprises:
a third PMOS transistor that is coupled to the first supply rail at its source and the drain of the first ambipolar transistor at its gate; and
a second current source that is coupled between the drain of the third PMOS transistor and the second supply rail.

4. The apparatus of claim 3, wherein the first and second ambipolar transistors further comprise graphene transistors, carbon nanotube (CNT) transistors, tunneling PETs (TPETs), or organic ambipolar PETs.

5. An apparatus comprising:
a first supply rail;
a second supply rail;
a first ambipolar transistor that is coupled to the first supply rail at its drain and that receives a reference voltage at its gate, wherein the reference voltage is substantially equal to logic high;
a second ambipolar transistor that is coupled to the first supply rail at its drain and that receives an input signal at its gate, wherein the input signal is substantially a square wave;
a current source that is coupled between the sources of the first and second ambipolar transistors and the second supply rail; and
an output circuit that is coupled to drain of the first ambipolar transistor and that outputs an output signal that is substantially the inverse of the input signal.

6. The apparatus of claim 5, wherein the apparatus further comprises a current mirror having:
a first PMOS transistor that is coupled to the first supply rail at its source and coupled to the drain of the first ambipolar transistor at its drain; and
a second PMOS transistor that is coupled to the first supply rail at its source and coupled to the drain of the second ambipolar transistor and the gate of the first PMOS transistor at its gate and drain.

7. The apparatus of claim 6, wherein the current source further comprises a first current source, and wherein the output circuit further comprises:
a third PMOS transistor that is coupled to the first supply rail at its source and the drain of the first ambipolar transistor at its gate; and
a second current source that is coupled between the drain of the third PMOS transistor and the second supply rail.

8. The apparatus of claim 7, wherein the first and second ambipolar transistors further comprise graphene transistors, CNT transistors, TFETs, or organic ambipolar PETs.

9. An apparatus comprising:
a first supply rail;
a second supply rail; and
a frequency quadrupler that receives an input signal that is substantially a triangular wave signal or a sine wave signal having a first frequency and that outputs a output signal that is substantially a pulse train signal having a second frequency, wherein the second frequency is about four times the first frequency, and wherein the quadruper has a first frequency doubler and a second frequency doubler coupled together in a pipeline, wherein each of the first and second frequency doublers includes:
an input terminal;
an output terminal;
a first ambipolar transistor that is coupled to the first supply rail at its drain and that receives a reference voltage at its gate;
a second ambipolar transistor that is coupled to the first supply rail at its drain and to the input terminal at its gate;
a current source that is coupled between the sources of the first and second ambipolar transistors and the second supply rail; and
an output circuit that is coupled to drain of the first ambipolar transistor and to the output terminal.

10. The apparatus of claim 9, wherein each frequency doubler further comprises a current mirror having:
a first PMOS transistor that is coupled to the first supply rail at its source and coupled to the drain of the first ambipolar transistor at its drain; and
a second PMOS transistor that is coupled to the first supply rail at its source and coupled to the drain of the second ambipolar transistor and the gate of the first PMOS transistor at its gate and drain.

11. The apparatus of claim 10, wherein the current source further comprises a first current source, and wherein each output circuit further comprises:
a third PMOS transistor that is coupled to the first supply rail at its source, the drain of the first ambipolar transistor at its gate, and its output terminal at its drain; and
a second current source that is coupled between the drain of the third PMOS transistor and the second supply rail.

12. The apparatus of claim 11, wherein the first and second ambipolar transistors further comprise graphene transistors, CNT transistors, TFETs, or organic ambipolar transistors.

13. An apparatus comprising:
a first supply rail;
a second supply rail; and
a delay line that receives an input signal that is substantially a square wave signal, wherein the delay line has a plurality of inverters coupled together in a pipeline, wherein each of the inverters includes:
an input terminal;
an output terminal;

a first ambipolar transistor that is coupled to the first supply rail at its drain and that receives a reference voltage at its gate, wherein the reference voltage is approximately equal to logic high;

a second ambipolar transistor that is coupled to the first supply rail at its drain and to the input terminal at its gate;

a current source that is coupled between the sources of the first and second ambipolar transistors and the second supply rail; and an output circuit that is coupled to drain of the first ambipolar transistor and to the output terminal.

14. The apparatus of claim 13, wherein each inverter further comprises a current mirror having:

a first PMOS transistor that is coupled to the first supply rail at its source and coupled to the drain of the first ambipolar transistor at its drain; and a second PMOS transistor that is coupled to the first supply rail at its source and coupled to the drain of the second ambipolar transistor and the gate of the first PMOS transistor at its gate and drain.

15. The apparatus of claim 14, wherein the current source further comprises a first current source, and wherein each output circuit further comprises:

a third PMOS transistor that is coupled to the first supply rail at its source, the drain of the first ambipolar transistor at its gate, and its output terminal at its drain; and a second current source that is coupled between the drain of the third PMOS transistor and the second supply rail.

16. The apparatus of claim 15, wherein the first and second ambipolar transistors further comprise graphene transistors, CNT transistors, TFETs, or organic ambipolar transistors.

* * * * *